United States Patent
Potin et al.

(10) Patent No.: US 11,753,594 B2
(45) Date of Patent: Sep. 12, 2023

(54) METHOD FOR TREATING AN OIL LOADED WITH PAH

(71) Applicant: SAFRAN CERAMICS, Le Haillan (FR)

(72) Inventors: Jean-François Daniel René Potin, Moissy-Cramayel (FR); Arnaud Delehouze, Moissy-Cramayel (FR); Stéphane Roger André Goujard, Moissy-Cramayel (FR)

(73) Assignee: SAFRAN CERAMICS, Le Haillan (FR)

( * ) Notice: Subject to any disclaimer, the term of this patent is extended or adjusted under 35 U.S.C. 154(b) by 0 days.

(21) Appl. No.: 17/642,547

(22) PCT Filed: Sep. 25, 2020

(86) PCT No.: PCT/FR2020/051676
§ 371 (c)(1),
(2) Date: Mar. 11, 2022

(87) PCT Pub. No.: WO2021/058922
PCT Pub. Date: Apr. 1, 2021

(65) Prior Publication Data
US 2022/0325190 A1 Oct. 13, 2022

(30) Foreign Application Priority Data

Sep. 26, 2019 (FR) ...................... 1910651

(51) Int. Cl.
*C10G 21/06* (2006.01)
*C10G 21/14* (2006.01)
*C10G 29/20* (2006.01)
*C10G 31/06* (2006.01)

(52) U.S. Cl.
CPC ............ *C10G 31/06* (2013.01); *C10G 29/205* (2013.01); *C10G 2300/1062* (2013.01); *C10G 2300/201* (2013.01)

(58) Field of Classification Search
CPC ........ C10G 21/06; C10G 21/14; C10G 29/20; C10G 31/06; C10G 2300/201
See application file for complete search history.

(56) References Cited

U.S. PATENT DOCUMENTS

| 5,242,579 A * | 9/1993 | Mead .................... C10G 21/30 |
| | | 208/322 |
| 2003/0101869 A1* | 6/2003 | Baudry ............. B01D 53/1487 |
| | | 96/275 |
| 2013/0153470 A1* | 6/2013 | Mezza ................... C10G 21/18 |
| | | 208/290 |
| 2017/0072363 A1* | 3/2017 | Potin ................... C23C 16/4412 |

FOREIGN PATENT DOCUMENTS

| FR | 3 039 162 A1 | 1/2017 |
| FR | 3 061 199 A1 | 6/2018 |
| WO | WO 03/047725 A2 | 6/2003 |
| WO | WO 2015/132527 A2 | 9/2015 |
| WO | WO 2016/016748 A1 | 2/2016 |

OTHER PUBLICATIONS

C. V. de Souza and S. M. Correa, Polycyclic Aromatic Hydrocarbons in Diesel Emission, Diesel Fuel and Lubricant Oil, 185 Fuel 925-931 (2016).*
International Search Report as issued in International Patent Application No. PCT/FR2020/051676, dated Nov. 27, 2020.

* cited by examiner

*Primary Examiner* — Randy Boyer
(74) *Attorney, Agent, or Firm* — Pillsbury Winthrop Shaw Pittman LLP

(57) ABSTRACT

A method for treating an aromatic mineral oil or a mixture of aromatic mineral oil and naphthenic mineral oil, the oil or the mixture of oils being loaded with polycyclic aromatic hydrocarbons, the method including a—optional removal of polycyclic aromatic hydrocarbon s having a molecular weight greater than or equal to 200 from the aromatic mineral oil or the mixture of aromatic mineral oil and naphthenic mineral oil loaded with polycyclic aromatic hydrocarbons; b—extraction, at a pressure lower than atmospheric pressure, of polycyclic aromatic hydrocarbons having a molecular weight lower than 200 solubilised in the oil or the mixture of oils obtained in step (a); and c—recovery of the oil or the mixture of oils depleted in polycyclic aromatic hydrocarbons.

18 Claims, No Drawings

METHOD FOR TREATING AN OIL LOADED WITH PAH

CROSS-REFERENCE TO RELATED APPLICATIONS

This application is the U.S. National Stage of PCT/FR2020/051676, filed Sep. 25, 2020, which in turn claims priority to French patent application number 1910651 filed Sep. 26, 2019. The content of these applications are incorporated herein by reference in their entireties.

The present invention concerns the field of oils loaded with polycyclic aromatic hydrocarbons and their treatment.

In the field of brake disc production from carbon-carbon materials, the step of densification using gas is very important because it enables the material matrix to be manufactured. The method is, however, very long and relatively expensive. It is essential to continuously search for novel solutions in order to reduce the densification time and to reduce the cost of products.

The conventional scheme of a densification facility comprises:
- a furnace in which is located a reactor containing the parts to be densified;
- oil-based scrubbing of the gas leaving the reactor or any other treatment of by-products contained in the gas;
- a gas pumping assembly which maintains the level of vacuum in the reactor by extracting the decomposed gases;
- recovery of the gas at the outlet of the facility which may also require a gas cleaning step.

The gas leaving the pyrolytic carbon densification reactor contains polycyclic aromatic hydrocarbons (PAH). Treatment of the gas is essential in order to protect the equipment from clogging phenomena caused by the presence of PAH. Industrial facilities include such gas treatments. Many means are used to capture the PAH (filtration, condensation, scrubbing). The preferred method consists in scrubbing the gas with an oil which has a high solubilisation capacity for PAH, including under vacuum. Thus, patent applications WO 03/047725 and WO 2015/132527 describe such methods using aromatic mineral oils, alone or in mixture with a naphthenic mineral oil. Indeed, these oils are the most efficient for this type of treatment.

The gas is thus treated by scrubbing with cold oil before being pumped and recovered. Consequently, the management of the scrubbing fluid is important in the operation of the facilities. The periodic renewal of the oil is a recurrent cost which weighs on the production cost. PAH are CMR substances which leads to the loaded oil being considered a hazardous waste. However, no such a method for treating these oils is described in the prior art.

However, the inventors have realised that it was possible to carry out such a treatment so as to be able to reuse the treated oils.

The present invention therefore relates to a method for treating an aromatic mineral oil or a mixture of aromatic mineral oil and naphthenic mineral oil, said oil or said mixture of oils being loaded with polycyclic aromatic hydrocarbons (PAH), advantageously containing at most 30% by volume polycyclic aromatic hydrocarbons, characterised in that it comprises the following steps:
- a—optional removal of polycyclic aromatic hydrocarbons having a molecular weight greater than or equal to 200 from the aromatic mineral oil or the mixture of aromatic mineral oil and naphthenic mineral oil loaded with polycyclic aromatic hydrocarbons;
- b—extraction, under a pressure lower than atmospheric pressure, of polycyclic aromatic hydrocarbons having a molecular weight lower than 200 solubilised in the oil or the mixture of oils obtained in step (a);
- c—recovery of the oil or the mixture of oils depleted in polycyclic aromatic hydrocarbons.

Advantageously the aromatic mineral oil or the mixture of aromatic mineral oil and naphthenic mineral oil is as described in patent applications WO 03/047725 and WO 2015/132527.

Thus, in an advantageous embodiment, the mixture of oils comprises at least 20% by volume aromatic mineral oil with respect to the total volume of the mixture, advantageously at least 30% by volume aromatic mineral oil. The naphthenic mineral oil content depends on the viscosity to be attained in the mixture. The mixture of oils comprises at most 80% by volume naphthenic mineral oil with respect to the total volume of the mixture, in particular at most 70% by volume naphthenic mineral oil. In a particular embodiment, the mixture of oils comprises at least 10% by volume naphthenic mineral oil with respect to the total volume of the mixture, in particular at least 14% by volume naphthenic mineral oil, more particularly at least 20% by volume naphthenic mineral oil. Still more advantageously, the mixture of oils has a viscosity less than or equal to 150 $mm^2/s$ at 0° C. when the mixture contains no PAH. The measurement of the kinematic viscosity of an oil according to the invention is made in accordance with standard ASTM D445 dated 2013 using an Ubbelhode viscometer with capillaries of diameter 0.88 mm. The viscosities are measured at 5 and 10° C. and the viscosity at 0° C. is obtained by linear extrapolation. Indeed, the measurement at 0° C. cannot be carried out directly because of the condensation formed due to the large temperature difference between the part and the analysis system. The viscometer constant is measured using undecane.

Advantageously, the aromatic mineral oil of the method according to the present invention is as described in patent application WO 03/047725. In particular, the aromatic mineral oil has a low vapour pressure, preferably less than 1 Pa at 0° C. Advantageously, the aromatic mineral oil, when it contains no PAH, has a viscosity less than or equal to 75 $mm^2/s$ at 0° C., more particularly less than or equal to 73 $mm^2/s$ at 0° C. The viscosity is measured as indicated above for the mixture of oils.

In an advantageous embodiment, the aromatic mineral oil as a xylene-based oil. It can thus be the synthesis oil marketed under the name "Jaritherm AX 320" by the French company Arkema and consisting of 85% by weight monoxylyxylene and 15% by weight di-xylyxylene. This oil has a viscosity of 73 $mm^2/s$ at 0° C. and a vapour pressure at 0° C. of less than 1 Pa. It can also be the xylene-based aromatic mineral oil marketed by TOTAL LUBRIFIANTS under the name "Jaritherm BT06" and consisting of a mixture of dibenzyltoluene (20 to 30% by weight) and benzyltoluene (70 to 80% by weight) or the xylene-based aromatic mineral oil marketed by TOTAL LUBRIFIANTS under the name "Jaritherm DBT" and consisting of a mixture of isomers of dibenzyltoluene or even the aromatic mineral oil AZOLLA NET HC marketed by TOTAL LUBRIFIANTS.

The naphthenic mineral oil of the method according to the invention can be a naphthenic hydrodesulfurised refined light distillate. Its paraffin oil content is advantageously less than 50%. Similarly to the aromatic mineral oil, the naphthenic mineral oil advantageously has a low vapour pressure, preferably less than 1 Pa at 0° C. Advantageously, the naphthenic mineral oil, when it contains no PAH, has a viscosity less than or equal to 75 mm$^2$/s at 0° C., more advantageously less than or equal to 70 mm$^2$/s à 0° C., more particularly less than or equal to 60 mm$^2$/s at 0° C. The viscosity is measured as indicated above for the mixture of oils. Thus, at atmospheric pressure, naphthenic mineral oil according to the present invention advantageously remains liquid at a temperature ≥200° C., advantageously ≥210° C., more advantageously ≥240° C., still more advantageously ≥250° C. In particular it can be the naphthenic mineral oil marketed by TOTAL LUBRIFIANTS under the name "ISO-VOLTINE II". The naphthenic mineral oil should not be confused with naphthenic solvents.

Polycyclic aromatic hydrocarbons (PAH) are well known to a person skilled in the art. It may concern, in particular, naphthalene, pyrene, phenanthrene, anthracene, acenaphthylene, acenaphthene and the mixtures thereof, more particularly naphthalene, phenanthrene, acenaphthene and the mixtures thereof. A list of PAH is, for example, indicated in the table below.

TABLE 1

| PAH | CAS No. |
|---|---|
| Naphthalene | 91-2062 |
| Acenaphthylene | 208-96-8 |
| Acenaphthene | 83-32-9 |
| Fluorene | 86-73-7 |
| Anthracene | 120-12-7 |
| Phenanthrene | 85-01-08 |
| Fluoranthene | 206-44-0 |
| Pyrene | 129-00-0 |
| Benzo(a)anthracene | 56-55-3 |
| Chrysene | 218-01-9 |
| Benzo(a)pyrene | 50-32-8 |
| Benzo(a)fluoranthene | 205-99-2 |
| Dibenzo(ah)anthracene | 53-70-3 |
| Benzo(k)fluoranthene | 207-08-9 |
| Benzo(ghi)perylene | 191-24-2 |
| Indeno(123cd)pyrene | 193-39-5 |

Therefore, advantageously, the polycyclic aromatic hydrocarbons are chosen from the list indicated in table 1 and the mixtures thereof, including acenaphthene, biphenyl, dibenzyltoluene and the mixtures thereof. In an advantageous embodiment, the PAH are chosen from acenaphthene, acenaphthylene, biphenyl, dibenzyltoluene, naphthalene, fluorene, phenanthrene and the mixtures thereof.

The PAH can be heavy PAH (molecular weight greater than or equal to 200) or medium or light PAH (molecular weight less than 200), advantageously it concerns medium or light PAH.

Particularly advantageously, the PAH are by-products of the reaction for chemical infiltration or vapour phase deposition for forming a deposit of pyrolytic carbon on substrates or for the densification of porous substrates by a pyrolytic carbon matrix such as a densification method using gas for the manufacture of carbon-carbon materials, for example for the production of brake discs. The gas precursor of this reaction is a hydrocarbon, typically methane, propane or a mixture of the two. The pressure and temperature of the reaction are controlled in order to produce the coating or the pyrolytic carbon matrix by decomposition (cracking) of the precursor gas in contact with the substrates.

Within the context of the present invention, "oil loaded with PAH" or "mixture of oils loaded with PAH" shall mean any oil or mixture of oils according to the invention containing more than 5% by volume PAH with respect to the total volume of oil or of the mixture of oils. In particular, the total PAH content of the oil or the mixture of oils is at most 30% by volume.

In a particular embodiment, the oil or the mixture of oils loaded with polycyclic aromatic hydrocarbons according to the invention originates from a method for scrubbing effluent gas containing polycyclic aromatic hydrocarbons. Advantageously, the effluent gas is advantageously produced by a method for chemical infiltration or vapour phase deposition for forming a deposit of pyrolytic carbon on substrates or for the densification of porous substrates by a pyrolytic carbon matrix such as a densification method using gas for the manufacture of carbon-carbon materials, for example for the production of brake discs.

This method of scrubbing effluent gases by the aromatic mineral oil or a mixture of aromatic mineral oil and naphthenic mineral oil is well known to a person skilled in the art and is described, for example, in patent applications WO 03/047725 and WO 2015/132527.

It can thus be performed by spraying the oil or the mixture of oils into a stream of effluent gas passing through a spray column, for example a venturi column. Advantageously, this scrubbing is performed at a pressure between 1×10$^3$ and 1×10$^5$ Pa, more advantageously at a pressure of 1000 Pa (10 mbar absolute), even if such a pressure does not facilitate the condensation of the PAH, which limits the absorption of the PAH by the oil. In another advantageous embodiment, this scrubbing method is carried out at a temperature less than 20° C., advantageously less than 0° C.

Advantageously, as described in patent application WO 03/047725, the mineral oil (either that comprising the aromatic mineral oil, or that comprising the mixture of aromatic mineral oil and naphthenic mineral oil, according to the variant used and the phase of the method) circulate continuously between a recirculation tank collecting the mineral oil loaded with polycyclic aromatic hydrocarbons and at least one nozzle for spraying oil into an effluent gas stream. The mineral oil is preferably cooled on its path between the recirculation tank and the spray nozzle or nozzles. More specifically, this cooling promotes the condensation of the PAH present in the effluent gas to be treated in order that they are entrained by the mineral oil during the spraying. Therefore, advantageously, the temperature of the mineral oil on arrival at the spray nozzle is less than 20° C., advantageously less than 0° C. Advantageously, the effluent gas to be treated is not itself cooled before its arrival at the scrubbing location. Thus, advantageously, the temperature of the effluent gas to be treated is less than 200° C. at the time of scrubbing.

The method for treating the oil or mixture of oils according to the invention therefore comprises an optional step (a) of removing polycyclic aromatic hydrocarbons having a molecular weight greater than or equal to 200 (heavy PAH) from the aromatic mineral oil or the mixture of aromatic mineral oil and naphthenic mineral oil loaded with polycyclic aromatic hydrocarbons. This step is only present in the case where the aromatic mineral oil or the mixture of aromatic mineral oil and naphthenic mineral oil loaded with polycyclic aromatic hydrocarbons contains polycyclic aromatic hydrocarbons having a molecular weight greater than or equal to 200 (heavy PAH). It can be implemented by methods that are well known to a person skilled in the art, such as decanting, precipitation for example by action on the temperature and/or filtration on a cartridge filter with or without automatic declogging.

The method for treating the oil or mixture of oils according to the invention therefore comprises a step (b) of extracting, at a pressure lower than atmospheric pressure, the polycyclic aromatic hydrocarbons having a molecular weight lower than 200 (light or medium PAH) solubilised in the oil or the mixture of oils obtained in step (a).

The pressure of step (b) is therefore less than atmospheric pressure, in other words less than 101 325 Pa. In particular, the pressure is greater than or equal to 100 Pa, more particularly between 100 and 50 000 Pa, even more particularly between 100 Pa and 1500 Pa, in particular 100 Pa or 1500 Pa.

Step (b) is advantageously implemented by generating, in particular in a controlled manner, a gas phase enriched in polycyclic aromatic hydrocarbons having a molecular weight less than 200. Advantageously, the gas phase enriched in polycyclic aromatic hydrocarbons having a molecular weight less than 200 comprises between 1 and 10% by volume polycyclic aromatic hydrocarbons having a molecular weight less than 200 with respect to the total volume of the gas, in particular between 2 and 5% by volume polycyclic aromatic hydrocarbons having a molecular weight less than 200 with respect to the total volume of the gas.

The temperature for implementing step (b) is advantageously between 0 and 300° C., in particular between 10 and 200° C., more particularly between 10 and 100° C.

Hence, step (b) can consist of controlled heating, at a pressure less than atmospheric pressure, of the oil or the mixture of oils to a temperature and a pressure enabling the generation of a vapour rich in polycyclic aromatic hydrocarbons having a molecular weight less than 200. The PAH having a molecular weight less than 200 are, indeed, more volatile than the oil or the mixture of oils according to the invention and they leave the liquid oil. In particular, the oil or the mixture of oils is held at a pressure greater than or equal to 100 Pa, more particularly between 100 and 50,000 Pa, even more particularly between 100 Pa and 1500 Pa, in particular 100 Pa or 1500 Pa.

In a particular embodiment, the heating takes place at a temperature greater than 120° C., advantageously greater than or equal to 130° C., in particular between 130 and 300° C., more particularly between 130 and 200° C., still more particularly between 130 and 150° C., more particularly greater than or equal to 140° C., still more particularly greater than or equal to 150° C. The vapour contains all the more PAH because these have low boiling points. Hence, the boiling points of the main PAH are listed in table 2 below.

TABLE 2

| PAH | NAPHTHALENE | PHENANTHRENE | ACENAPHTHENE |
|---|---|---|---|
| Boiling point in ° C. | 218 | 337 | 277 |

Table 3, below, lists the vapour pressures of various PAH as a function of the temperature.

TABLE 3

| | PAH | | | | | |
|---|---|---|---|---|---|---|
| T (° C.) | naphthalene P (mbar) | biphenyl P (mbar) | acenaphthene P (mbar) | fluorene P (mbar) | phenanthrene P (mbar) | dibenzyl-toluene P (mbar) |
| 15 | 0.039 | 0.004 | 0.001 | 0.000 | 0.000 | 0.000 |
| 20 | 0.067 | 0.007 | 0.002 | 0.000 | 0.000 | 0.000 |
| 25 | 0.110 | 0.013 | 0.003 | 0.001 | 0.000 | 0.000 |
| 30 | 0.179 | 0.023 | 0.006 | 0.001 | 0.000 | 0.000 |
| 35 | 0.285 | 0.039 | 0.010 | 0.003 | 0.001 | 0.000 |
| 40 | 0.448 | 0.066 | 0.017 | 0.005 | 0.001 | 0.000 |
| 45 | 0.691 | 0.109 | 0.029 | 0.008 | 0.002 | 0.000 |
| 50 | 1.049 | 0.178 | 0.048 | 0.014 | 0.004 | 0.001 |
| 55 | 1.571 | 0.283 | 0.078 | 0.022 | 0.006 | 0.001 |
| 60 | 2.319 | 0.444 | 0.126 | 0.036 | 0.010 | 0.001 |
| 65 | 3.379 | 0.685 | 0.198 | 0.058 | 0.016 | 0.001 |
| 70 | 4.860 | 1.038 | 0.307 | 0.091 | 0.026 | 0.002 |
| 75 | 6.907 | 1.358 | 0.470 | 0.141 | 0.042 | 0.003 |
| 80 | 9.702 | 1.826 | 0.708 | 0.215 | 0.065 | 0.004 |
| 85 | 12.465 | 2.432 | 1.054 | 0.323 | 0.099 | 0.005 |
| 90 | 15.770 | 3.210 | 1.550 | 0.478 | 0.148 | 0.007 |
| 95 | 19.804 | 4.198 | 2.178 | 0.698 | 0.219 | 0.011 |
| 100 | 24.694 | 5.444 | 2.833 | 1.008 | 0.307 | 0.015 |
| 105 | 30.583 | 7.002 | 3.656 | 1.439 | 0.413 | 0.021 |
| 110 | 37.631 | 8.936 | 4.682 | 2.029 | 0.551 | 0.030 |
| 115 | 46.016 | 11.320 | 5.952 | 2.847 | 0.730 | 0.042 |
| 120 | 55.932 | 14.236 | 7.514 | 3.659 | 0.958 | 0.058 |
| 125 | 67.597 | 17.781 | 9.422 | 4.667 | 1.247 | 0.082 |
| 130 | 81.245 | 22.061 | 11.740 | 5.910 | 1.612 | 0.113 |
| 135 | 97.132 | 27.198 | 14.536 | 7.433 | 2.068 | 0.157 |
| 140 | 115.535 | 33.327 | 17.893 | 9.287 | 2.634 | 0.216 |
| 150 | 161.111 | 49.177 | 26.652 | 14.224 | 4.191 | 0.403 |
| 200 | 663.644 | 255.728 | 146.294 | 86.986 | 30.368 | 5.990 |
| 250 | 1991.816 | 909.185 | 552.412 | 352.862 | 141.429 | 39.783 |
| 300 | 4786.718 | 2473.261 | 1595.166 | 1071.007 | 479.622 | 110.004 |

Naphthalene will thus be more entrained in the vapour phase than acenaphthene which will itself be more entrained in the vapour phase than phenanthrene.

It is likewise possible to reduce the heating temperature of step (b) of the method according to the invention by using an aromatic compound having a boiling point less than 100° C. at the operating pressure of the method. There is, indeed, a phenomenon of entraining of the PAH by the vapour of the aromatic compound. Thus, in an advantageous embodiment, the method according to the present invention comprises an intermediate step (a1) between steps (b) and (c) of adding, to the oil or to the mixture of oils obtained in step (a), an aromatic compound having a boiling point lower than 100° C. at the implementation pressure of step (b), advantageously at a pressure greater than or equal to 100 Pa, more particularly between 100 and 50 000 Pa, still more particularly between 100 Pa and 1500 Pa, in particular 100 Pa or 1500 Pa, and in that step (b) is implemented at a temperature less than 120° C., advantageously less than or equal to 100° C., in particular between 40 and 100° C., more particularly between 50 and 100° C., still more particularly between 60 and 100° C., in particular between 70 and 100° C., and at a pressure greater than or equal to 100 Pa, more particularly between 100 and 50 000 Pa, still more particularly between 100 Pa and 1500 Pa, in particular 100 Pa or 1500 Pa.

Advantageously, the aromatic compound having a boiling point lower than 100° C. at a pressure of 1500 Pa is toluene.

In another advantageous embodiment, step (b) of the method for treating the oil or the mixture of oils according to the invention consists in placing the oil or the mixture of oils in contact with a non-condensable gas, under agitation for example by bubbling, and at a pressure less than atmospheric pressure, so as to extract the polycyclic aromatic hydrocarbons from the oil or the mixture of oils.

The mass transfer of the PAH from the liquid phase to the gas phase stripping gas requires a continuous agitation of the liquid phase. This difficulty can be removed by bubbling a gas into the liquid.

In particular, the non-condensable gas is an inert gas such as nitrogen, or a hydrocarbon in gaseous form possibly containing $H_2$ or $N_2$, advantageously a hydrocarbon in gaseous form, in particular used in a densification method using gas for the manufacture of carbon-carbon materials, for example for the production of brake discs. Advantageously it is methane. Advantageously, the oil for the mixture of oil to be treated will be heated, for example to a temperature of 50° C. and at a pressure greater than or equal to 100 Pa, more particularly between 100 and 50 000 Pa, still more particularly between 100 Pa and 1500 Pa, in particular 100 Pa or 1500 Pa, and placed in intimate contact with the gas for extraction of PAH under agitation, for example passing through a stripping column. A packing column is an example of equipment enabling this extraction of compounds solubilised in a liquid. The extraction gas is usually available under pressure, which allows pressure drops in the column. The column can operate in batch mode or in continuous mode. Batch operation is preferred for its simplicity of operation. The light PAH (in particular, naphthalene) are easily extracted from the oil by this method. The quantity of oil carried away is low compared with the cumulative quantity of PAH carried away by the gas such as methane.

In an advantageous embodiment, step (b) of the method according to the invention is not a distillation step. In another advantageous embodiment, step (b) of the method according to the invention does not comprise a distillation step. More advantageously, the method according to the invention does not comprise a distillation step, in particular a step of distilling the aromatic mineral oil or a mixture of aromatic mineral oil and naphthenic mineral oil.

Advantageously, the oil or the mixture of oils depleted in polycyclic aromatic hydrocarbons obtained in step (c) comprises at most 10% by mass of the initial quantity of polycyclic aromatic hydrocarbons (namely of that initially contained (before optional step (a)) in the aromatic mineral oil or in the mixture of aromatic mineral oil and naphthenic mineral oil), advantageously between 5 and 10% by mass of the initial quantity of polycyclic aromatic hydrocarbons, more advantageously at most 5% by mass of the initial quantity of polycyclic aromatic hydrocarbons.

In a particular embodiment, the method according to the invention comprises an additional step (d) of treating polycyclic aromatic hydrocarbons extracted from the oil or the mixture of oils according to the invention. The treatment of the flow of PAH may be a thermal oxidation, a condensation, an adsorption on active carbon or indeed a use in the method for densification of pyrolytic carbon.

In another particular embodiment, the method according to the invention comprises a preliminary step (A) of generating an aromatic mineral oil or a mixture of aromatic mineral oil and naphthenic mineral oil, said oil or said a mixture of oils being loaded with polycyclic aromatic hydrocarbons, by scrubbing an effluent gas containing polycyclic aromatic hydrocarbons. Advantageously, the effluent gas originates from a method for chemical infiltration or vapour phase deposition for forming a deposit of pyrolytic carbon on substrates or for the densification of porous substrates by a pyrolytic carbon matrix such as a densification method using gas for the manufacture of carbon-carbon materials, for example for the production of brake discs.

This step of scrubbing effluent gases by the aromatic mineral oil or a mixture of aromatic mineral oil and naphthenic mineral oil is well known to a person skilled in the art and is described, for example, in patent applications WO 03/047725 and WO 2015/132527.

It can thus be performed by spraying the oil or the mixture of oils into a stream of effluent gas passing through a spray column, for example a venturi column. Advantageously, this scrubbing step is performed at a pressure between $1 \times 10^3$ and $1 \times 10^5$ Pa, more advantageously at a pressure of 1000 Pa (10 mbar absolute), even if such a pressure does not facilitate the condensation of the PAH, which limits the absorption of the PAH by the oil. In another advantageous embodiment, this scrubbing step is performed at a temperature less than 20° C., advantageously less than 0° C.

Advantageously, as described in patent application WO 03/047725, the mineral oil (either that comprising the aromatic mineral oil, or that comprising the mixture of aromatic mineral oil and naphthenic mineral oil, according to the variant used and the phase of the method) circulate continuously between a recirculation tank collecting the mineral oil loaded with polycyclic aromatic hydrocarbons and at least one nozzle for spraying oil into an effluent gas stream. The mineral oil is preferably cooled on its path between the recirculation tank and the spray nozzle or nozzles. More specifically, this cooling promotes the condensation of the PAH present in the effluent gas to be treated in order that they are entrained by the mineral oil during the spraying. Therefore, advantageously, the temperature of the mineral oil on arrival at the spray nozzle is less than 20° C., advantageously less than 0° C. Advantageously, the effluent gas to be treated is not itself cooled before its arrival at the scrubbing location. Thus, advantageously, the temperature of the effluent gas to be treated is less than 200° C. at the time of scrubbing.

In yet another advantageous embodiment, the method according to the invention comprises an additional step (e) of recycling the oil or the mixture of oils depleted in polycyclic aromatic hydrocarbons obtained in step (c) in the step of scrubbing the effluent gas containing polycyclic aromatic hydrocarbons.

The invention claimed is:

1. A method for treating an aromatic mineral oil or a mixture of aromatic mineral oil and naphthenic mineral oil, said oil or said mixture of oils being loaded with polycyclic aromatic hydrocarbons, said method comprising the following steps:
- a—optional removal of polycyclic aromatic hydrocarbons having a molecular weight greater than or equal to 200 from the aromatic mineral oil or the mixture of aromatic mineral oil and naphthenic mineral oil loaded with polycyclic aromatic hydrocarbons;
- b—extraction, under a pressure lower than atmospheric pressure, of polycyclic aromatic hydrocarbons having a molecular weight lower than 200 solubilised in the aromatic mineral oil or the mixture of aromatic mineral oil and naphthenic mineral oil loaded with polycyclic aromatic hydrocarbons, wherein step (b) is implemented by generating a gas phase enriched in polycyclic aromatic hydrocarbons having a molecular weight less than 200, and
- c—recovery of the oil or the mixture of oils depleted in polycyclic aromatic hydrocarbons.

2. The method according to claim 1, wherein step (b) consists of controlled heating, at a pressure less than atmospheric pressure, of the oil or the mixture of oils to a temperature and a pressure enabling the generation of a vapour rich in polycyclic aromatic hydrocarbons having a molecular weight less than 200.

3. The method according to claim 2, wherein the temperature is higher than 120° C. and the pressure is 1500 Pa.

4. The method according to claim 2, further comprising an intermediate step (a1) between steps (b) and (c) of adding, to the oil or to the mixture of oils obtained in step (a), an aromatic compound having a boiling point lower than 100° C. at a pressure of 1500 Pa and in that step (b) is implemented at a temperature less than 120° C. and at a pressure of 1500 Pa.

5. The method according to claim 4, wherein the aromatic compound is toluene.

6. The method according to claim 1, wherein step (b) comprises placing the oil or the mixture of oils in contact with a non-condensable gas, under agitation and at a pressure less than atmospheric pressure, so as to extract the polycyclic aromatic hydrocarbons from the oil or the mixture of oils.

7. The method according to claim 6, wherein the non-condensable gas is an inert gas or a hydrocarbon in gaseous form.

8. The method according to claim 1, further comprising an additional step (d) of treating polycyclic aromatic hydrocarbons extracted from the oil or the mixture of oils.

9. The method according to claim 1, wherein the oil or the mixture of oils loaded with polycyclic aromatic hydrocarbons originates from a method for scrubbing effluent gas containing polycyclic aromatic hydrocarbons.

10. The method according to claim 9, further comprising a preliminary step (A) of generating an aromatic mineral oil or a mixture of aromatic mineral oil and naphthenic mineral oil, said oil or said mixture of oils being loaded with polycyclic aromatic hydrocarbons, by scrubbing an effluent gas containing polycyclic aromatic hydrocarbons.

11. The method according to claim 1, wherein said method does not comprise a distillation step.

12. A method according to claim 1, wherein the aromatic mineral oil or the mixture of aromatic mineral oil and naphthenic mineral oil contains at most 30% by volume of polycyclic aromatic hydrocarbons.

13. The method according to claim 3, wherein the temperature is between 130 and 150° C.

14. The method according to claim 4, wherein the temperature is between 60 and 100° C.

15. The method according to claim 7, wherein the non-condensable gas is methane.

16. The method according to claim 9, wherein the effluent gas originates from a method for chemical infiltration or vapour phase deposition for forming a deposit of pyrolytic carbon on substrates or for the densification of porous substrates by a pyrolytic carbon matrix.

17. The method according to claim 10, which comprises an additional step (e) of recycling the oil or the mixture of oils depleted in polycyclic aromatic hydrocarbons obtained in step (c) in the step of scrubbing effluent gas containing polycyclic aromatic hydrocarbons.

18. The method according to claim 1, wherein step (b) is implemented by generating in a controlled manner a gas phase enriched in polycyclic aromatic hydrocarbons having a molecular weight less than 200.

* * * * *